(12) United States Patent
Sakaguchi

(10) Patent No.: US 8,482,054 B2
(45) Date of Patent: Jul. 9, 2013

(54) SEMICONDUCTOR MEMORY DEVICE

(75) Inventor: Takeshi Sakaguchi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,422

(22) Filed: Sep. 21, 2011

(65) Prior Publication Data

US 2012/0068257 A1 Mar. 22, 2012

(30) Foreign Application Priority Data

Sep. 22, 2010 (JP) ................................ 2010-212799

(51) Int. Cl.
*H01L 29/792* (2006.01)
(52) U.S. Cl.
USPC ........................................................ 257/324
(58) Field of Classification Search
USPC ........................................................ 257/324
See application file for complete search history.

(56) References Cited

U.S. PATENT DOCUMENTS

| | | | | |
|---|---|---|---|---|
| 6,632,723 B2 * | 10/2003 | Watanabe et al. | ............. | 438/421 |
| 6,693,310 B1 * | 2/2004 | Takahashi et al. | ............ | 257/136 |
| 2008/0017911 A1 * | 1/2008 | Akahori et al. | ............... | 257/314 |
| 2008/0258202 A1 * | 10/2008 | Shimizu | ......................... | 257/316 |
| 2009/0039444 A1 * | 2/2009 | Suzuki | .......................... | 257/392 |

FOREIGN PATENT DOCUMENTS

| | | |
|---|---|---|
| JP | 2008-300427 | 12/2008 |
| JP | 2009-16615 | 1/2009 |
| JP | 2009-152498 | 7/2009 |
| JP | 2009-277858 | 11/2009 |

* cited by examiner

*Primary Examiner* — N Drew Richards
*Assistant Examiner* — Ratisha Mehta
(74) *Attorney, Agent, or Firm* — Oblon, Spivak, McClelland, Maier & Neustadt, L.L.P.

(57) ABSTRACT

According to one embodiment, there is provided a semiconductor memory device including an element region, a first gate insulating film, a charge accumulation layer, a second gate insulating film, and a control gate electrode. The charge accumulation layer covers the first gate insulating film. The second gate insulating film has a first portion and a second portion. The first portion covers an upper surface of the charge accumulation layer when a side of a surface on which the element region of the semiconductor substrate is demarcated is an upper side. The second portion covers a side surface of the charge accumulation layer. The control gate electrode covers the upper surface and the side surface of the charge accumulation layer via the second gate insulating film. A breakdown voltage of the first portion is higher than a breakdown voltage of the second portion.

18 Claims, 8 Drawing Sheets

SEMICONDUCTOR MEMORY DEVICE

CROSS-REFERENCE TO RELATED APPLICATIONS

This application is based upon and claims the benefit of priority from Japanese Patent Application No. 2010-212799, filed on Sep. 22, 2010; the entire contents of which are incorporated herein by reference.

FIELD

Embodiments described herein relate generally to a semiconductor memory device.

BACKGROUND

In a NAND-type flash memory (a semiconductor memory device), tightening the space between adjacent charge accumulation layers due to higher integration requires thinning the film thickness of the charge blocking layer (a second gate insulating film) formed so as to cover the charge accumulation layers. However, thinning the charge blocking layer causes electrons (a charge) accumulated in the charge accumulation layers to be prone to leak out through the charge blocking layer into the control gate electrode, and thus the charge retention properties of the charge accumulation layers tend to deteriorate.

DETAILED DESCRIPTION

In general, according to one embodiment, there is provided a semiconductor memory device including an element region, a first gate insulating film, a charge accumulation layer, a second gate insulating film, and a control gate electrode. The element region is demarcated by an element isolating portion within the semiconductor substrate. The first gate insulating film is provided on the element region. The charge accumulation layer is provided on the first gate insulating film. The second gate insulating film has a first portion and a second portion. The first portion covers an upper surface of the charge accumulation layer when a side of a surface on which the element region of the semiconductor substrate is demarcated is an upper side. The second portion covers a side surface of the charge accumulation layer. The control gate electrode is provided above the upper surface and the side surface of the charge accumulation layer via the second gate insulating film. A breakdown voltage of the first portion is higher than a breakdown voltage of the second portion.

Exemplary embodiments of a semiconductor memory device will be explained below in detail with reference to the accompanying drawings. The present invention is not limited to the following embodiments.

First Embodiment

Figure 1:
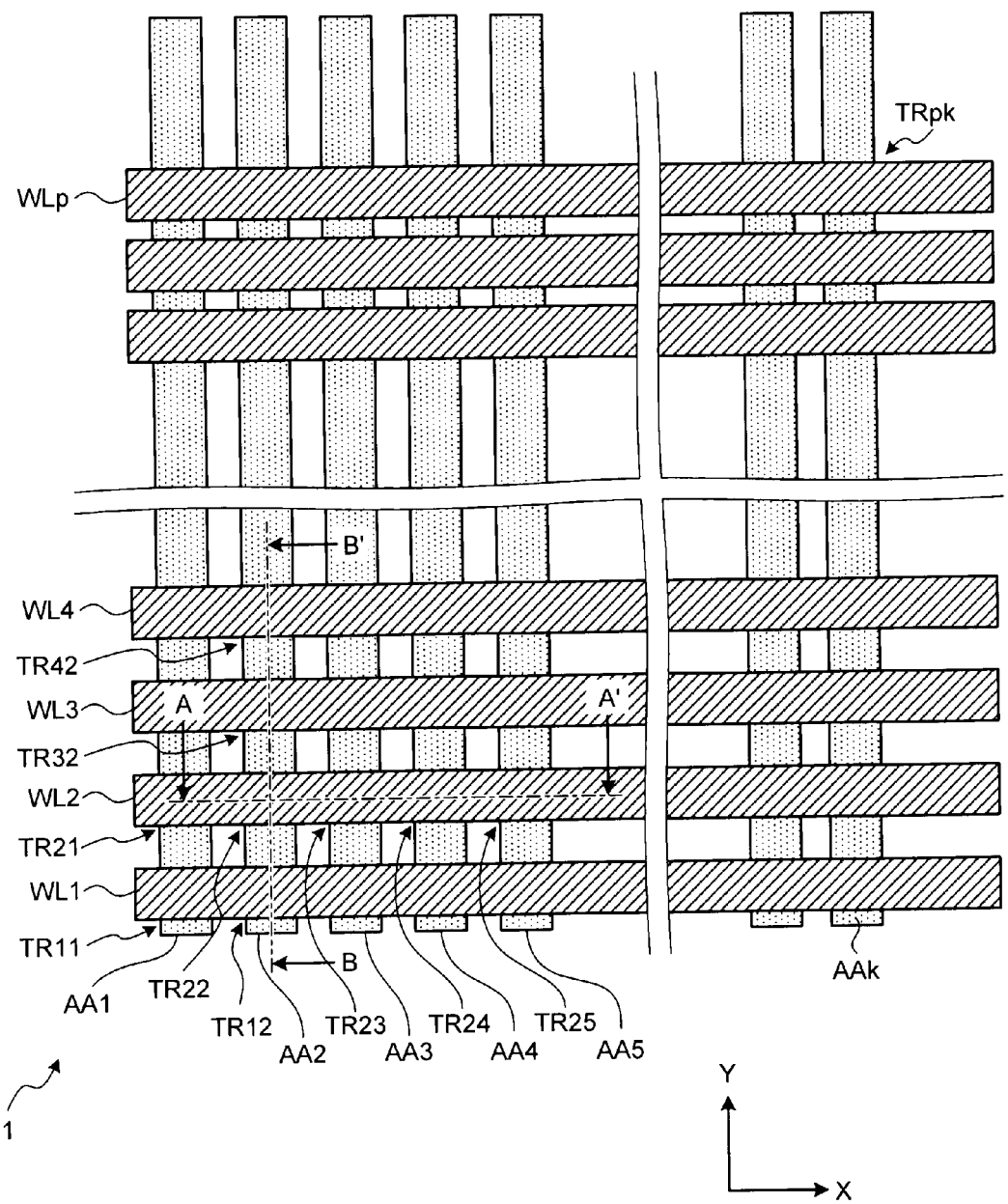
FIG. 1 is a diagram illustrating the layout configuration of the semiconductor memory device according to a first embodiment.

With reference to FIG. 1, the schematic configuration of a semiconductor memory device 1 according to a first embodiment is described. FIG. 1 is a plan view illustrating the layout configuration of the semiconductor memory device 1.

The semiconductor memory device 1 includes a semiconductor substrate 10 (see FIG. 2A), plural word lines WL1 to WLp (where p is an integer), and plural transistors TR11 to TRpk (where k is an integer). The semiconductor memory device 1 is, for example, a NAND-type flash memory.

The semiconductor substrate 10 has plural element isolating portions 11 (see FIG. 2A) and plural active areas (element regions) AA1 to AAk (where k is an integer). Each of the active areas AA1 to AAk is demarcated by an element isolating portion 11 within the semiconductor substrate 10. The respective active areas AA1 to AAk extend in the Y direction of FIG. 1 (hereinafter simply called the Y direction), and also are lined up side by side (for example, in parallel to each other). The plural active areas AA1 to AAk are arranged in the X direction of FIG. 1 (hereinafter simply called the X direction).

The plural word lines WL1 to WLp (where p is an integer) are arranged so as to intersect with the plural active areas AA1 to AAk (where k is an integer) when viewed from the direction perpendicular to the surface of the semiconductor substrate 10. That is, the respective word lines WL1 to WLp extend in the X direction and also are lined up side by side (for example, in parallel to each other). The plural word lines WL1 to WLp are arranged in the Y direction. The respective word lines WL1 to WLp, as described below, function as the control gate electrode of the corresponding transistors TR11 to TRpk.

The plural transistors TR11 to TRpk are arranged at positions where the plural active areas AA1 to AAk and the plural word lines WL1 to WLp are intersecting. The plural transistors TR11 to TRpk function as plural memory cells in the semiconductor memory device 1 (which is, for example, a NAND-type flash memory). The plural transistors TR11 to TRpk are respectively arranged two-dimensionally in the X direction and the Y direction. For example, the transistors TR21 to TR25 are arranged at positions where the word line WL2 and the active areas AA1 to AA5 are intersecting (see FIG. 2A). For example, the transistors TR12 to TR42 are respectively arranged at positions where the word lines WL1 to WL4 and the active area AA2 are intersecting (see FIG. 2B). The respective transistors TR11 to TRpk have, for example, a charge accumulation layer 30 described below for trapping a charge (electrons, for example) (see FIG. 2A).

Figure 2A:
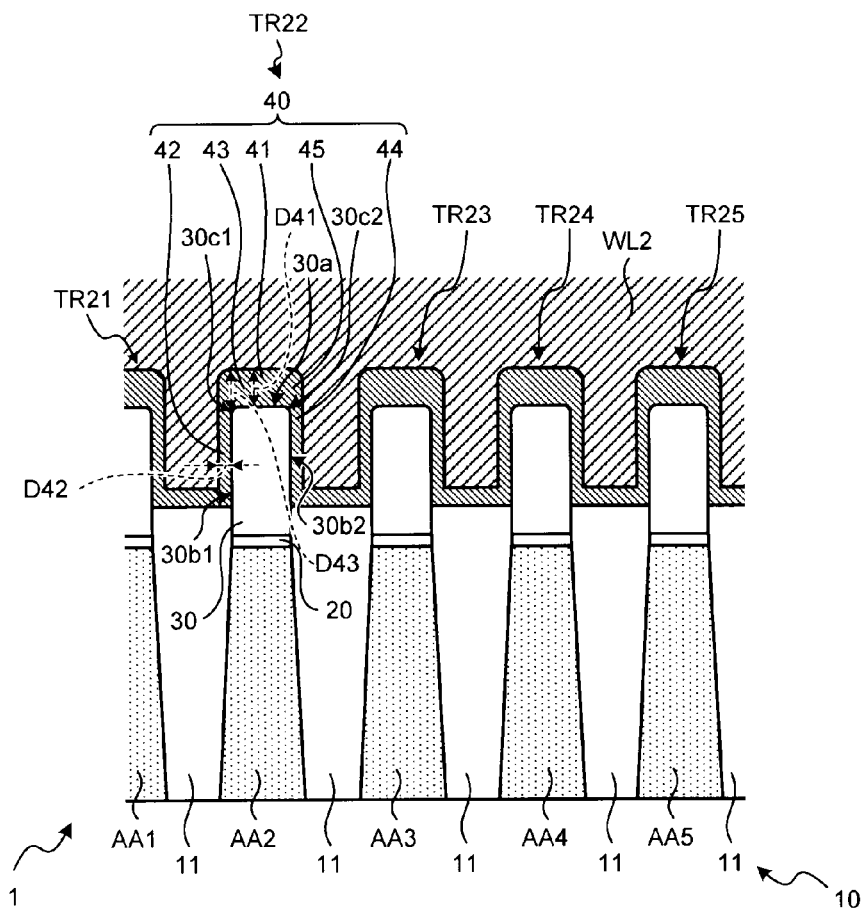
FIGS. 2A and 2B are diagrams illustrating the cross-sectional configuration of the semiconductor memory device according to the first embodiment.
Figure 2B:
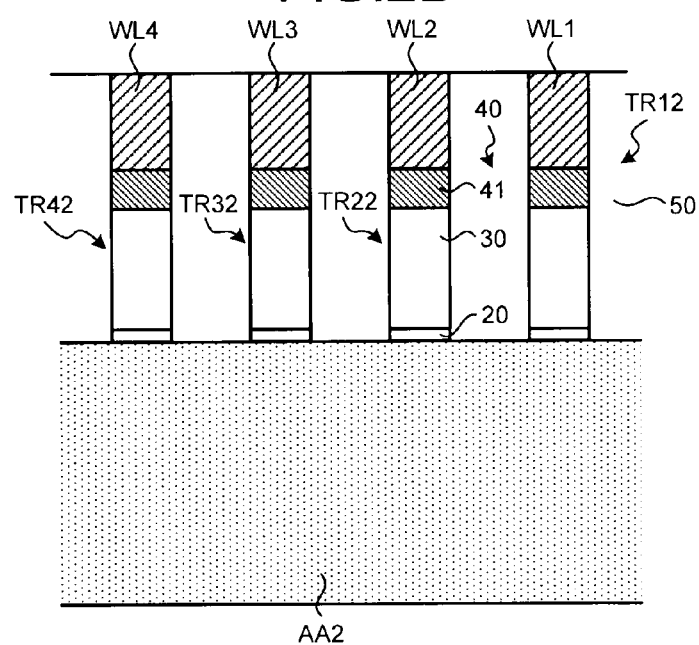

Next, with reference to FIGS. 2A and 2B, the configuration of the respective transistors in the semiconductor memory device 1 is described. FIG. 2A is a diagram illustrating the cross-sectional configuration of the respective transistors in the semiconductor memory device 1, and is a diagram illustrating the cross-section taken along the A-A' line of FIG. 1 (a cross-section of the X direction). FIG. 2B is a diagram illustrating the cross-sectional configuration of the respective transistors in the semiconductor memory device 1, and is a diagram illustrating the cross-section taken along the B-B' line of FIG. 1 (a cross-section of the Y direction). The following is an illustrative description of the configuration associated with the transistor TR22 arranged at a position where the word line WL2 and the active area AA2 intersect, but other transistors TR11 to TR21 and TR23 to TRpk are also the same as the transistor TR22.

With respect to the transistor TR22, the semiconductor memory device 1 includes an active area (element region) AA2, a gate insulating film (first gate insulating film) 20, a charge accumulation layer 30, a charge blocking layer (second gate insulating film) 40, and a control gate electrode (word line) WL2. It is noted that in the follow description, the word line WL2 is described as the control gate electrode WL2.

The active area AA2 is demarcated by the element isolating portion 11 within the semiconductor substrate 10. The active area AA2 is formed of a semiconductor (silicon, for example) in which the portion corresponding to the charge accumulation layer 30 includes, for example, first conductive type (for example, P-type) impurities, and is formed of a semiconductor (silicon, for example) in which the portion corresponding to between the charge accumulation layer 30 and the adjacent charge accumulation layer 30 includes, for example, second conductive type (for example, N-type) impurities. The element isolating portion 11 electrically isolates the active area AA2 from other active areas (for example, active areas AA1 and AA3). The element isolating portion 11 has, for example, an STI-type structure, and is formed of an insulating substance (for example, silicon oxide). The upper surface of the element isolating portion 11 is lower than, for example, the upper surface of the charge accumulation layer 30. The upper surface of the active area AA2 is lower than, for example, the upper surface of the element isolating portion 11.

The gate insulating film 20 covers the upper surface of the active area AA2. The gate insulating film 20 is formed of an insulating substance (for example, silicon oxide). The upper surface of the gate insulating film 20 is lower than, for example, the upper surface of the element isolating portion 11. The gate insulating film 20 functions as a tunnel oxide film that tunnels the charge (for example, electrons) between the active area AA2 and the charge accumulation layer 30.

The charge accumulation layer 30 covers the upper surface of the gate insulating film 20. The charge accumulation layer 30 accumulates charge tunneled from the active area AA2 via the gate insulating film 20. The charge accumulation layer 30 possess a shape that extends in a direction perpendicular to the surface of the semiconductor substrate 10 (for example, a substantially prismatic shape), and both the width of the X direction (see FIG. 2A) and the width of the Y direction (see FIG. 2B) are smaller than the thickness of the depth direction. The charge accumulation layer 30 is formed of a semiconductor (for example, amorphous silicon, polysilicon, and silicon-germanium) that contains, for example, second conductive type (for example, N-type) impurities. Alternatively, the charge accumulation layer 30 may be formed of, for example, a metallic material.

The charge accumulation layer 30 has an upper surface 30a, side surfaces 30b1 and 30b2, and boundary portions 30c1 and 30c2. The side surface 30b1 is the side surface of the +X side of the charge accumulation layer 30 in the X direction (the direction in which the control gate electrode WL2, that is, the word line WL2 illustrated in FIG. 1 extends). The side surface 30b1 is the side surface of the −X side of the charge accumulation layer 30 in the X direction. The boundary portion 30c1 is the edge portion serving as the boundary between the upper surface 30a and the side surface 30b1. The boundary portion 30c2 is the edge portion serving as the boundary between the upper surface 30a and the side surface 30b2.

The charge blocking layer 40 covers the upper surface 30a, the side surfaces 30b1 and 30b2, and the boundary portions 30c1 and 30c2 of the charge accumulation layer 30. The charge blocking layer 40 thereby has the function of blocking (suppressing) the charge accumulated by the charge accumulation layer 30 from leaking into the control gate electrode WL2. The charge blocking layer 40 may be formed of a single layer of, for example, silicon oxide film or silicon nitride film, or may be formed of stacked films of silicon oxide film and/or silicon nitride film. For example, the charge blocking layer 40 may be formed of an ONO film (silicon oxide film/silicon nitride film/silicon oxide film). Alternatively, the charge blocking layer 40 may be formed of a metallic insulating film. It is noted that the side surfaces of the charge accumulation layer 30 in the Y direction are covered not by the charge blocking layer 40 but rather by an interlayer insulating film 50 (see FIG. 2B).

The charge blocking layer 40 has a first portion 41, second portions 42 and 44, and third portions 43 and 45. The first portion 41 covers the upper surface 30a of the charge accumulation layer 30. The second portion 42 covers the side surface 30b1 of the charge accumulation layer 30. The second portion 44 covers the side surface 30b2 of the charge accumulation layer 30. That is, the second portions 42 and 44 cover the both side surfaces 30b1 and 30b2 of the charge accumulation layer 30 in the X direction. The third portion 43 covers the boundary portion 30c1 of the charge accumulation layer 30. The third portion 45 covers the boundary portion 30c2 of the charge accumulation layer 30.

A film thickness D41 of the first portion 41 is thicker than a film thickness D42 of the second portion 42. The breakdown voltage of the first portion 41 is thereby higher than the breakdown voltage of the second portion 42. The same is true of the second portion 44.

Further, a film thickness D43 of the third portion 43 is thicker than a film thickness D42 of the second portion 42. The breakdown voltage of the third portion 43 is thereby higher than the breakdown voltage of the second portion 42. The same is true of the third portion 45.

The control gate electrode WL2 covers the upper surface 30a, the side surfaces 30b1 and 30b2, and the boundary portions 30c1 and 30c2 of the charge accumulation layer 30 via the charge blocking layer 40. The control gate electrode WL2 functions as a gate electrode for controlling the transistor TR22. The control gate electrode WL2 is formed of a semiconductor (for example, polysilicon) containing, for example, second conductive type (for example, N-type) impurities. Alternatively, the control gate electrode WL2 may be formed of, for example, a metallic material (for example, tungsten).

Figure 6:
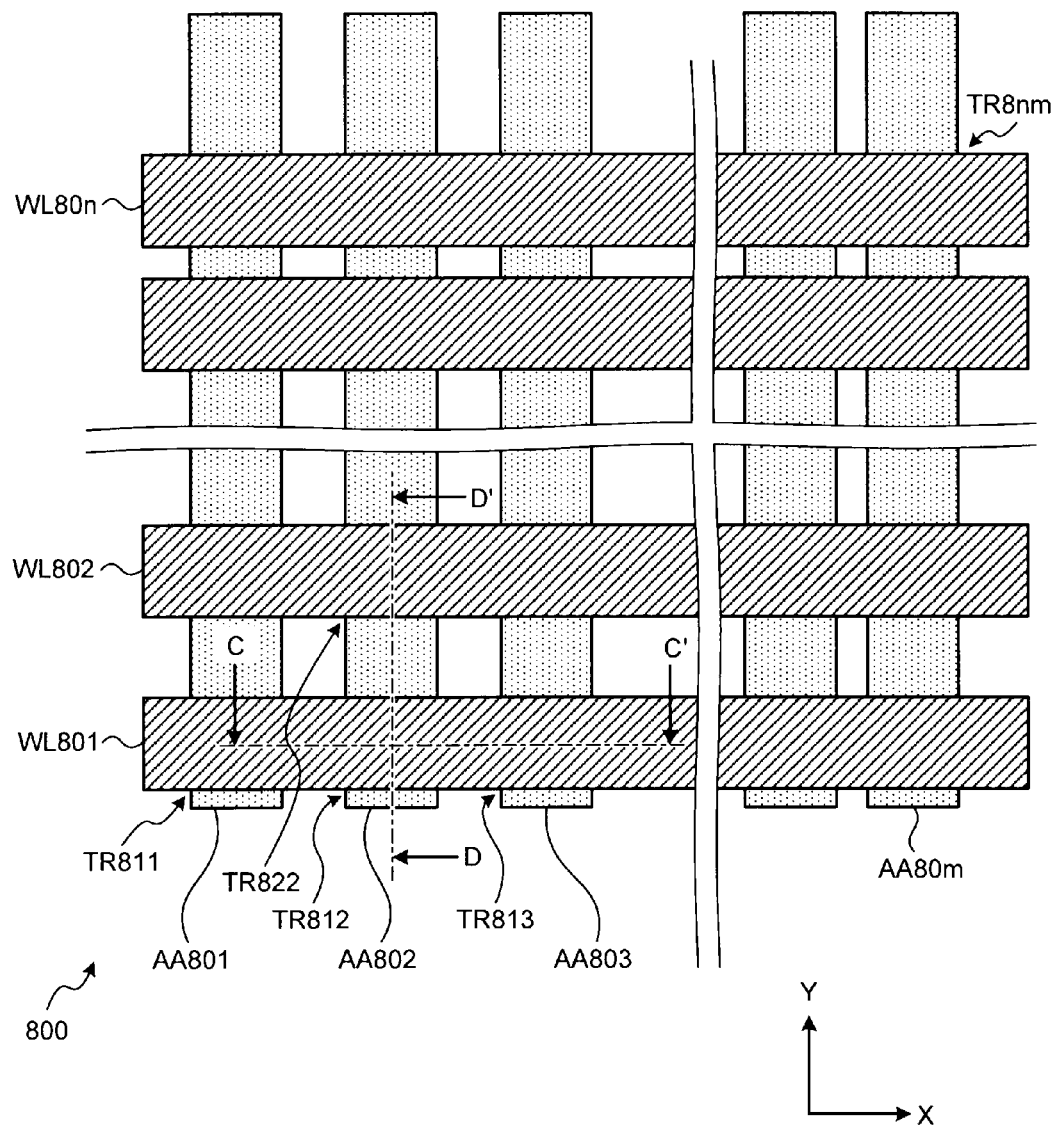
FIG. 6 is a diagram illustrating the layout configuration of the semiconductor memory device according to a comparative example.
Figure 7A:
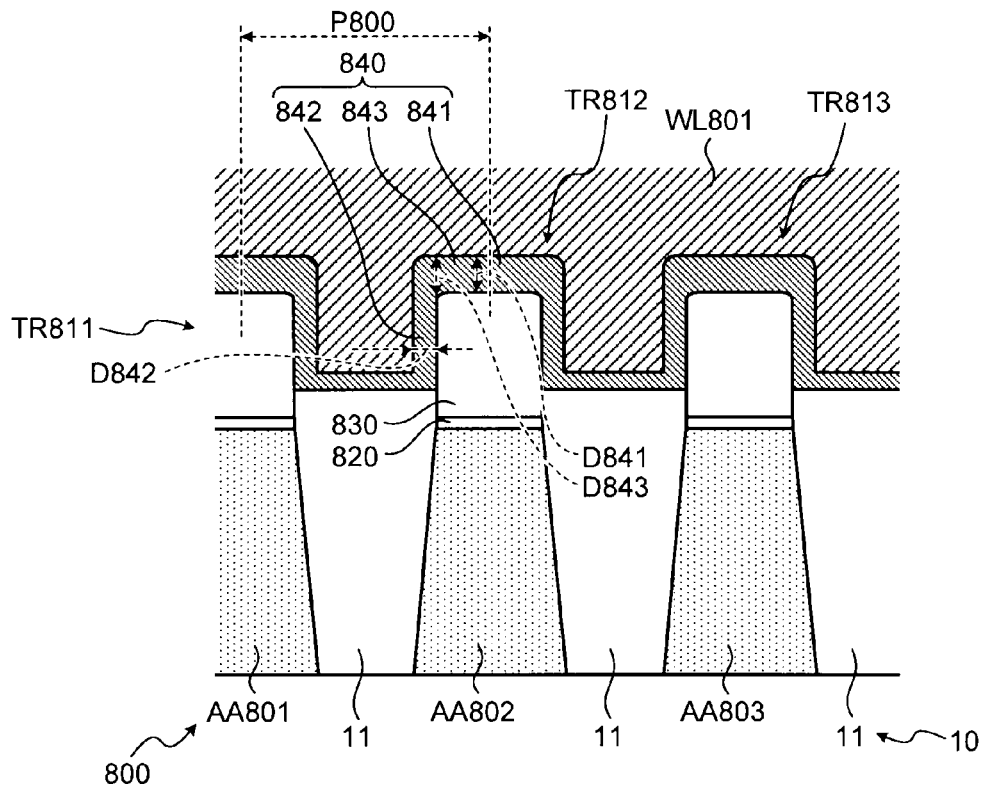
FIGS. 7A and 7B are diagrams illustrating the cross-sectional configuration of the semiconductor memory device according to a comparative example.
Figure 7B:
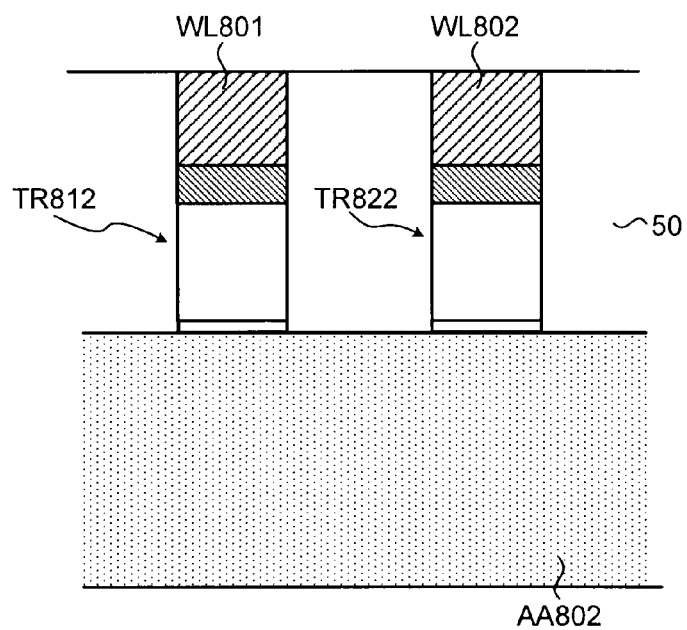
Figure 8A:
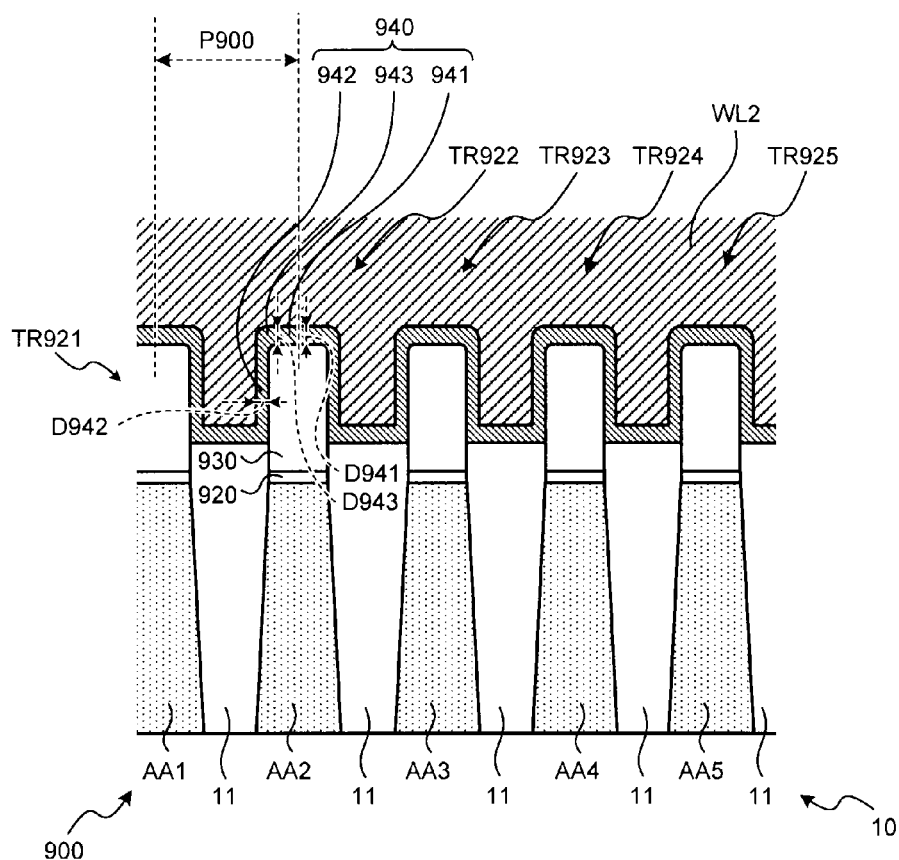
FIGS. 8A and 8B are diagrams illustrating the cross-sectional configuration of the semiconductor memory device according to another comparative example.
Figure 8B:
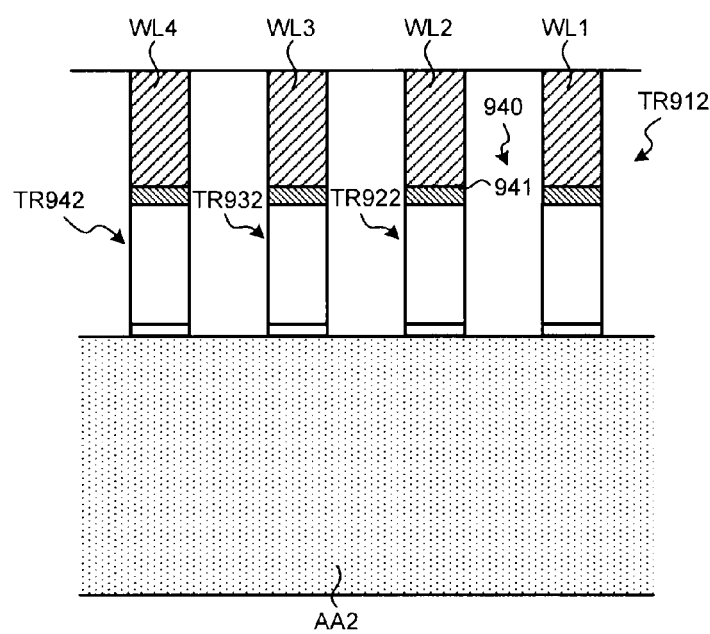

Herein, in contrast to a configuration in which the both width of the active areas and the width of the word lines are broad, consideration is provisionally given to when both are simply narrowed. For example, in the semiconductor memory device 800 illustrated in FIG. 6, plural transistors TR811 to TR8nm are arranged at positions where plurality of word lines WL801 to WL80n and plural active areas AA801 to AA80m are intersecting. For example, the transistors TR811 to TR813 are respectively arranged at positions where the word line WL801 and the active areas AA801 to AA803 are intersecting (see FIG. 7A). For example, the transistors TR812 and TR822 are respectively arranged at positions where the word lines WL801 and WL802 and the active area AA802 are intersecting (see FIG. 7B). It is noted that FIG. 7A is a diagram illustrating a cross-section taken along the C-C' line of FIG. 6 (a cross-section in the X direction). FIG. 7B is a diagram illustrating a cross-section taken along the D-D' line of FIG. 6 (a cross-section in the Y direction). In the semiconductor memory device 800, in the charge accumulation layer 830 covering the gate insulating film 820, both the width in the X direction (see FIG. 7A) and the width in the Y direction (see FIG. 7B) are either equivalent to the thickness in the depth direction or greater than the thickness in the depth direction. Further, in the charge blocking layer 840, a thickness D841 of the portion 841 covering the upper surface of the charge accumulation layer 830, a thickness D842 of the portion 842 covering the side surface of the charge accumulation layer 830, and a thickness D843 of the portion 843 covering the boundary portions of the charge accumulation layer 830 are all equivalent. In such a configuration, in order to increase the arrangement density of the plurality of transistors (TR-921 to TR942 and the like illustrated in FIGS. 8A and 8B), a semiconductor memory device 900 illustrated in FIGS. 8A and 8B is obtained by narrowing the width of the active areas and the width of the word lines, and also by narrowing the interval between adjacent charge accumulation layers (the arrangement pitch) from P800 to P900.

In this semiconductor memory device 900, in a charge accumulation layer 930 covering a gate insulating film 920, the width in the X direction (see FIG. 8A) and the width in the Y direction (see FIG. 8B) are both made to be smaller than the thickness in the depth direction. Further, in a charge blocking layer 940, by the interval (the arrangement pitch) P900 between the adjacent charge accumulation layers 930 being narrowed, the film thickness is uniformly thinned. That is, in the charge blocking layer 940, a thickness D941 of the portion 941 covering the upper surface of the charge accumulation layer 930, a thickness D942 of the portion 942 covering the side surface of the charge accumulation layer 930, and a thickness D943 of the portion 943 covering the boundary portion of the charge accumulation layer 930 are all equivalent. In such a case, because the width in the X direction of the charge accumulation layer 930 is narrow, there is a tendency in the charge blocking layer 940 for an electric field to be concentrated not only on the portion (the portion having curvature) 943 covering the boundary portion of the charge accumulation layer 930, but also on the portion 941 covering the upper surface of the charge accumulation layer 930. As a result, the charge accumulated in the charge accumulation layer 930 becomes prone to leak out into the control gate electrode WL2 via the portions 943 and 941 of the charge blocking layer 940, and thus the properties of the charge accumulation layer 930 for retaining the charge tend to deteriorate.

On the contrary, in the first embodiment, in the charge blocking layer 40, the breakdown voltage of the first portion 41 covering the upper surface 30a of the charge accumulation layer 30 is made to be higher than the breakdown voltage of the second portions 42 and 44 covering the side surfaces 30b1 and 30b2 of the charge accumulation layer 30. The charge accumulated in the charge accumulation layer 30 can be thereby prevented from leaking out into the control gate electrode WL2 via the first portion 41 of the charge blocking layer 40. That is, the deterioration of properties of the charge accumulation layer 30 for retaining the charge can be suppressed because leakage of the charge accumulated in the charge accumulation layer 30 to the control gate electrode WL2 via the charge blocking layer 40 can be reduced. It is further possible to suppress deterioration of the write saturation voltage.

Specifically, as illustrated in FIG. 2A, the film thickness D41 of the first portion 41 is made to be thicker than the film thickness D42 of the second portion 42. With this configuration, it is easily possible to achieve a configuration in which the breakdown voltage of the first portion 41 is made to be higher than the breakdown voltage of the second portion 42.

In addition, as illustrated in FIG. 2A, the film thickness D42 of the second portion 42, which accounts for a larger portion of the surface area in comparison to the first portion 41 in the electrostatic capacity between the charge accumulation layer 30 and the control gate electrode WL2, can be maintained thin. It is thereby possible to increase the electrostatic capacity between the charge accumulation layer 30 and the control gate electrode WL2 (which can increase the saturation charge of the charge accumulation layer 30), while still reducing leakage of the charge accumulated in the charge accumulation layer 30 into the control gate electrode WL2 via the charge blocking layer 40.

Also, in the first embodiment, in the charge blocking layer 40, the breakdown voltage of the third portions 43 and 45 covering the boundary portions 30c1 and 30c2 of the charge accumulation layer 30 is made to be higher than the breakdown voltage of the second portions 42 and 44 covering the side surfaces 30b1 and 30b2 of the charge accumulation layer 30. Thereby, there is less likely to be leakage of the charge accumulated in the charge accumulation layer 30 into the control gate electrode WL2 via the third portions 43 and 45 of the charge blocking layer 40. That is, leakage of the charge accumulated in the charge accumulation layer 30 to the control gate electrode WL2 via the charge blocking layer 40 can be further reduced, and therefore it is thus even easier to suppress the deterioration of properties of the charge accumulation layer 30 for retaining the charge. Moreover, deterioration of the write saturation voltage can be even more easily suppressed.

Specifically, as illustrated in FIG. 2A, the film thickness D43 of the third portion 43 is made to be thicker than the film thickness D42 of the second portion 42. It is thereby easily possible to achieve a configuration in which the breakdown voltage of the third portion 43 is higher than the breakdown voltage of the second portion 42.

In addition, as illustrated in FIG. 2A, the film thickness D42 of the second portion 42, which accounts for a larger portion of the surface area in comparison to the third portion 43 in the electrostatic capacity between the charge accumulation layer 30 and the control gate electrode WL2, can be maintained thin. It is thereby possible to increase the electrostatic capacity between the charge accumulation layer 30 and the control gate electrode WL2 (which can increase the saturation charge of the charge accumulation layer 30), while still reducing leakage of the charge accumulated in the charge accumulation layer 30 into the control gate electrode WL2 via the charge blocking layer 40. Because the film thickness D42 of the second portion 42 can be maintained thin, the capability of the control gate electrode WL2 to be embedded in between adjacent charge accumulation layers 30 can be enhanced.

Second Embodiment

Figure 3A:
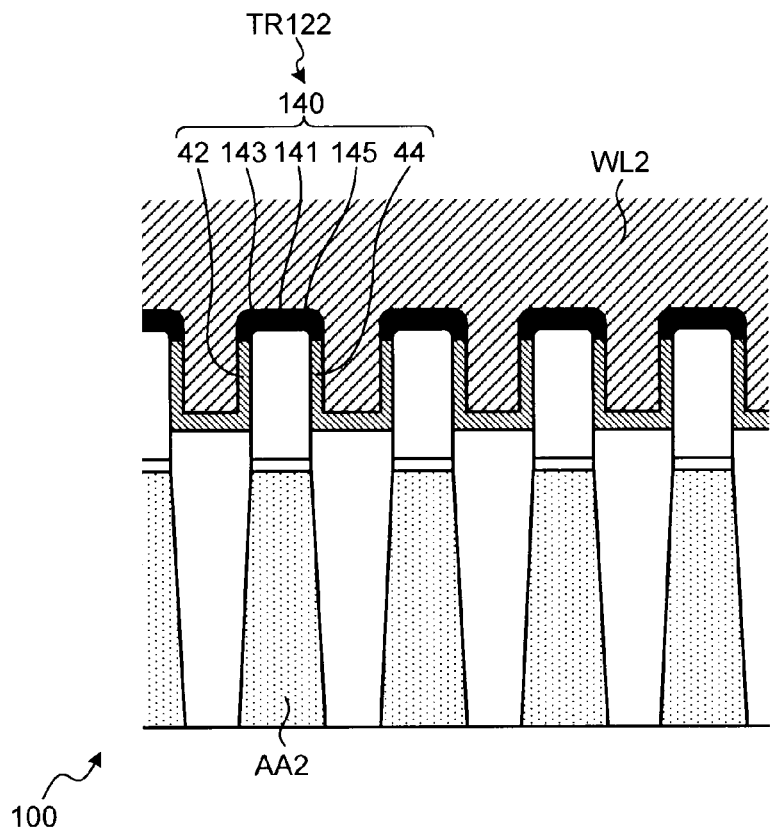
FIGS. 3A and 3B are diagrams illustrating the cross-sectional configuration of the semiconductor memory device according to a second embodiment.
Figure 3B:
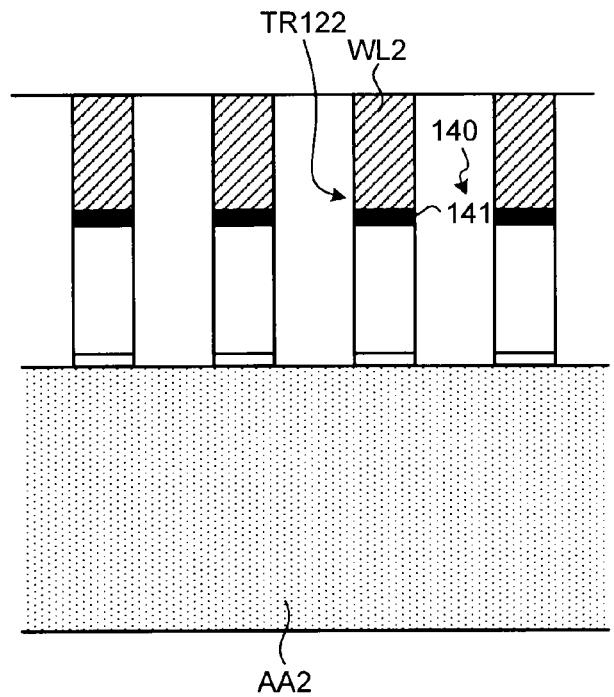

Next, with reference to FIGS. 3A and 3B, a semiconductor memory device 100 according to a second embodiment is described. FIG. 3A is a diagram illustrating the cross-sectional configuration of each transistor in the semiconductor memory device 100, and is a diagram illustrating a cross-section that corresponds to FIG. 2A (the cross-section in the X direction). FIG. 3B is a diagram illustrating the cross-sectional configuration of each transistor in the semiconductor memory device 100, and is a diagram illustrating a cross-section that corresponds to FIG. 2B (the cross-section in the Y direction). The description below focuses on those components that differ from the first embodiment.

With respect to a transistor TR122, the semiconductor memory device 100 includes a charge blocking layer (a second gate insulating film) 140. The charge blocking layer 140 has a first portion 141 and third portions 143 and 145.

The breakdown voltage per unit film thickness of a material of the first portion 141 (a first material) is made to be higher than the breakdown voltage per unit film thickness of the material of the second portions 42 and 44 (a second material). The material of the second portions 42 and 44 may be similar to that in the first embodiment. The breakdown voltage of the first portion 141 is thereby higher than the breakdown voltage of the second portion 42 despite the fact that the thickness of the first portion 141 is equivalent to the thickness of the second portions 42 and 44.

For example, a similar material can be used to form the first portion 141 and the second portions 42 and 44 provided that the film density of the first portion 141 is higher than the film density of the second portions 42 and 44. The breakdown voltage of the first portion 141 is thereby higher than the breakdown voltage of the second portion 42 despite the fact that the thickness of the first portion 141 is equivalent to the thickness of the second portions 42 and 44.

As an alternative example, a similar material system can be used to form the first portion 141 and the second portions 42 and 44, provided that the oxygen content of the first portion 141 is higher than the oxygen content of the second portions 42 and 44. The breakdown voltage of the first portion 141 is thereby higher than the breakdown voltage of the second portion 42 despite the fact that the thickness of the first portion 141 is equivalent to the thickness of the second portions 42 and 44.

As an alternative example, a material with a high dielectric constant (silicon nitride film, for example) can be used to form the first portion 141, and then a material with a low dielectric constant (silicon oxide film, for example) is used to form the second portions 42 and 44. The breakdown voltage of the first portion 141 is thereby higher than the breakdown voltage of the second portion 42 despite the fact that the thickness of the first portion 141 is equivalent to the thickness of the second portions 42 and 44.

Further, the breakdown voltage per unit film thickness of the material of the third portions 143 and 145 is made to be higher than the breakdown voltage per unit film thickness of the material of the second portions 42 and 44. The breakdown voltage of the third portions 143 and 145 is thereby higher than the breakdown voltage of the second portion 42 despite the fact that the thickness of the third portions 143 and 145 is equivalent to the thickness of the second portions 42 and 44.

For example, a similar material can be used to form the third portions 143 and 145 and the second portions 42 and 44, provided that the film density of the third portions 143 and 145 is made to be higher than the film density of the second portions 42 and 44. The breakdown voltage of the third portions 143 and 145 is thereby higher than the breakdown voltage of the second portion 42 despite the fact that the thickness of the third portions 143 and 145 is equivalent to the thickness of the second portions 42 and 44.

As an alternative example, a similar material system can be used for the third portions 143 and 145 and the second portions 42 and 44, provided that the oxygen content of the third portions 143 and 145 is higher than the oxygen content of the second portions 42 and 44. The breakdown voltage of the third portions 143 and 145 is thereby higher than the breakdown voltage of the second portion 42 despite the fact that the thickness of the third portions 143 and 145 is equivalent to the thickness of the second portions 42 and 44.

As an alternative example, a material with a high dielectric constant (silicon nitride film, for example) can be used to form the third portions 143 and 145, and then a material with a low dielectric constant (silicon oxide film, for example) is used to form the second portions 42 and 44. The breakdown voltage of the third portions 143 and 145 is thereby higher than the breakdown voltage of the second portion 42 despite the fact that the thickness of the third portions 143 and 145 is equivalent to the thickness of the second portions 42 and 44.

As described above, in the second embodiment, the breakdown voltage per unit film thickness of the material of the first portion 141 (the first material) is made to be higher than the breakdown voltage per unit film thickness of the material of the second portions 42 and 44 (the second material). With this configuration, it is easily possible to achieve a configuration in which the breakdown voltage of the first portion 141 is higher than the breakdown voltage of the second portions 42 and 44.

Further, the breakdown voltage per unit film thickness of the material of the third portions 143 and 145 is made to be higher than the breakdown voltage per unit film thickness of the material of the second portions 42 and 44. With this configuration, it is easily possible to achieve a configuration in which the breakdown voltage of the third portions 143 and 145 is higher than the breakdown voltage of the second portions 42 and 44.

Third Embodiment

Figure 4A:
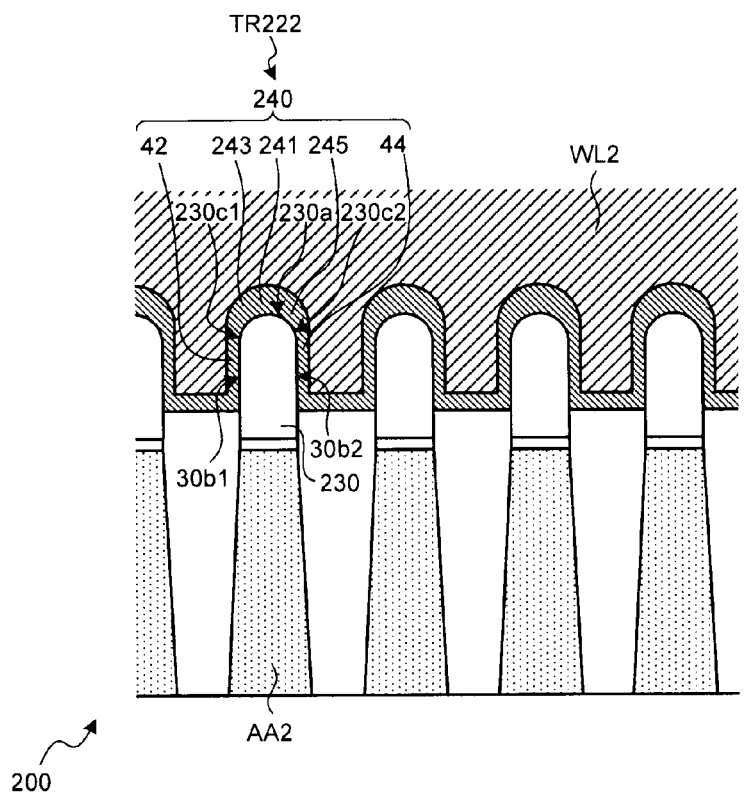
FIGS. 4A and 4B are diagrams illustrating the cross-sectional configuration of the semiconductor memory device according to a third embodiment.
Figure 4B:
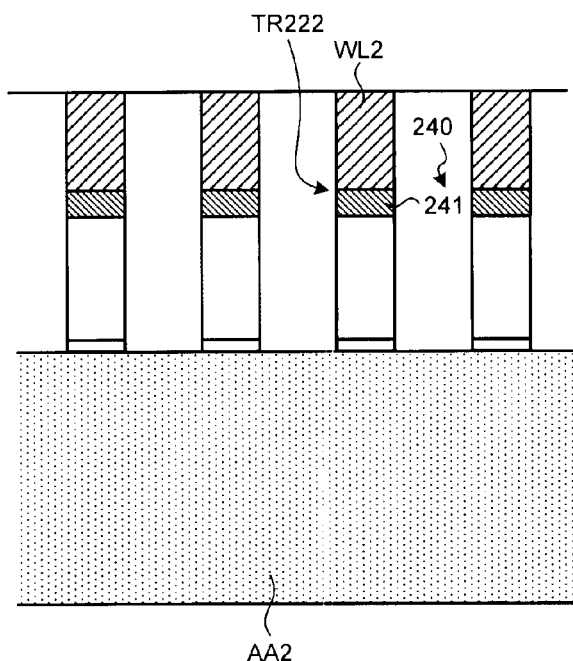

Next, with reference to FIGS. 4A and 4B, a semiconductor memory device 200 according to a third embodiment is described. FIG. 4A is a diagram illustrating the cross-sectional configuration of each transistor in the semiconductor memory device 200, and is a diagram illustrating a cross-section that corresponds to FIG. 2A (the cross-section in the X direction). FIG. 4B is a diagram illustrating the cross-sectional configuration of each transistor in the semiconductor memory device 200, and is a diagram illustrating a cross-section that corresponds to FIG. 2B (the cross-section in the Y direction). The description below focuses on those components that differ from the first embodiment.

With respect to a transistor TR222, the semiconductor memory device 200 includes a charge accumulation layer 230 and a charge blocking layer (second gate insulating film) 240.

The charge accumulation layer 230 has an upper surface 230a and boundary portions 230c1 and 230c2. The upper surface 230a is curved upward in a convex shape (for example, an arc shape). As a result, the angles formed between the upper surface 230a and the side surfaces 30b1 and 30b2 at the boundary portions 230c1 and 230c2 are made to be angles that are greater than 90° respectively.

The charge blocking layer 240 has a first portion 241 and third portions 243 and 245. The first portion 241 is curved upward in a convex shape (for example, an arch shape) along the upper surface 230a of the charge accumulation layer 230. As a result, the angles formed between the first portion 241 and the second portions 42 and 44 at the third portions 243 and 245 are made to be angles that are greater than 90° respectively.

As describe above, in the third embodiment, the first portion 241 is curved upward in a convex shape. As a result, the angles formed between the first portion 241 and the second portions 42 and 44 at the third portions 243 and 245 are made to be angles that are greater than 90° respectively. It is thereby possible to mitigate the electric field concentrations at the first portion 241 and third portions 243 and 245 of the charge blocking layer 240.

Fourth Embodiment

Figure 5A:
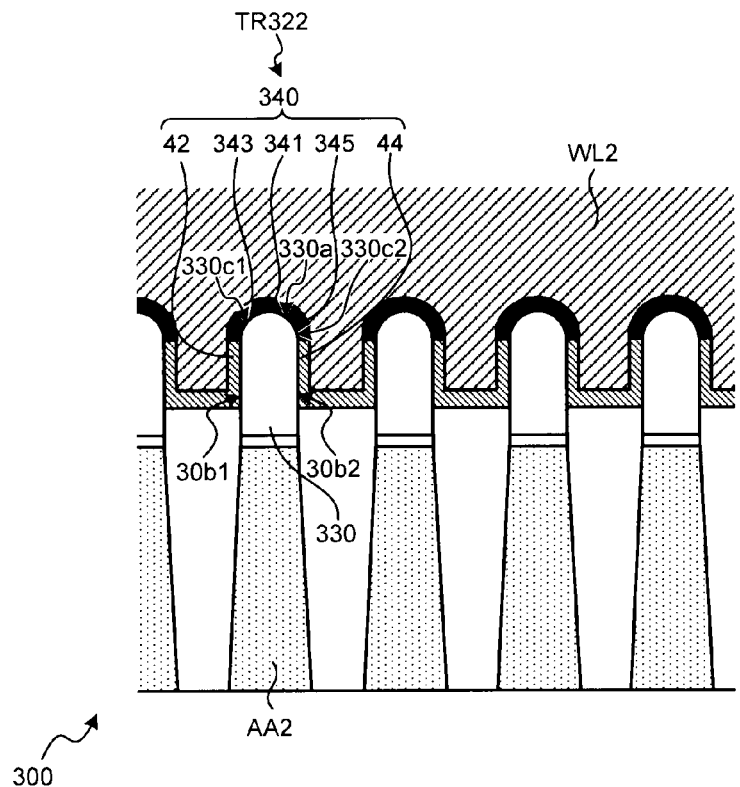
FIGS. 5A and 5B are diagrams illustrating the cross-sectional configuration of the semiconductor memory device according to a fourth embodiment.
Figure 5B:
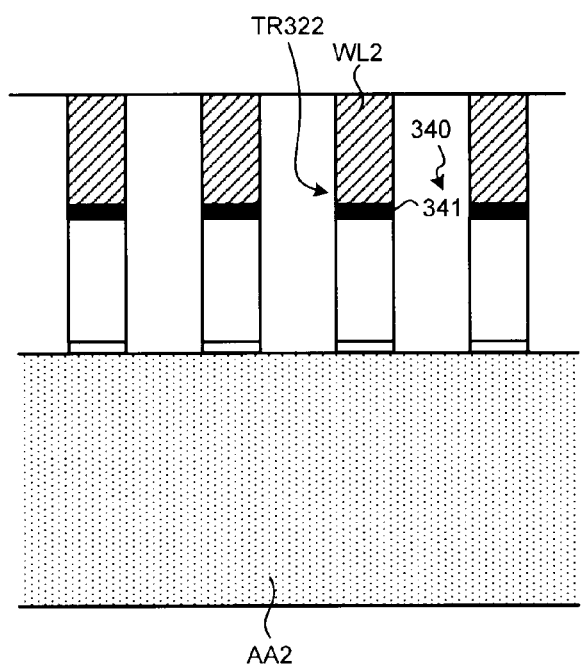

Next, with reference to FIGS. 5A and 5B, a semiconductor memory device 300 according to a fourth embodiment is described. FIG. 5A is a diagram illustrating the cross-sectional configuration of each transistor in the semiconductor memory device 300, and is a diagram illustrating a cross-section that corresponds to FIG. 3A (the cross-section in the X direction). FIG. 5B is a diagram illustrating the cross-sectional configuration of each transistor in the semiconductor memory device 300, and is a diagram illustrating a cross-section that corresponds to FIG. 3B (the cross-section in the Y direction). The description below focuses on those components that differ from the second embodiment.

With respect to a transistor TR322, the semiconductor memory device 300 includes a charge accumulation layer 330 and a charge blocking layer (second gate insulating film) 340.

The charge accumulation layer 330 has an upper surface 330a and boundary portions 330c1 and 330c2. The upper surface 330a is curved upward in a convex shape (for example, an arc shape). As a result, the angles formed between the upper surface 330a and the side surfaces 30b1 and 30b2 at the boundary portions 330c1 and 330c2 are made to be angles that are greater than 90° respectively.

The charge blocking layer 340 has a first portion 341 and third portions 343 and 345. The first portion 341 is curved upward in a convex shape (in an arc shape, for example) along the upper surface 330a of the charge accumulation layer 330. As a result, the angles formed between the first portion 341 and the second portions 42 and 44 at the third portions 343 and 345 are made to be angles that are greater than 90° respectively. The breakdown voltage per unit film thickness of the material of the first portion 341 (a first material) is made to be higher than the breakdown voltage per unit film thickness of the material of the second portions 42 and 44 (a second material). The material of the second portions 42 and 44 may be similar to that in the second embodiment. The breakdown voltage of the first portion 341 is thereby higher than the breakdown voltage of the second portion 42 despite the fact that the thickness of the first portion 341 is equivalent to the thickness of the second portions 42 and 44. Further, the breakdown voltage per unit film thickness of the material of the third portions 343 and 345 is made to be higher than the breakdown voltage per unit film thickness of the material of the second portions 42 and 44. The breakdown voltage of the third portions 343 and 345 is thereby higher than the breakdown voltage of the second portion 42 despite the fact that the thickness of the third portions 343 and 345 is equivalent to the thickness of the second portions 42 and 44.

As describe above, in the fourth embodiment, the first portion 341 is curved upward in a convex shape. As a result, the angles formed between the first portion 341 and the second portions 42 and 44 at the third portions 343 and 345 are made to be angles that are greater than 90° respectively. It is thereby possible to mitigate the electric field concentrations at the first portion 341 and the third portions 343 and 345 of the charge blocking layer 340. The breakdown voltage per unit film thickness of the material of the first portion 341 (the first material) is made to be higher than the breakdown voltage per unit film thickness of the material of the second portions 42 and 44 (the second material). With this configuration, it is easily possible to achieve a configuration in which the breakdown voltage of the first portion 341 is higher than the breakdown voltage of the second portions 42 and 44. Further, the breakdown voltage per unit film thickness of the material of the third portions 343 and 345 is made to be higher than the breakdown voltage per unit film thickness of the material of the second portions 42 and 44. With this configuration, it is easily possible to achieve a configuration in which the breakdown voltage of the third portions 343 and 345 is higher than the breakdown voltage of the second portions 42 and 44.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   an element region demarcated by an element isolating portion within a semiconductor substrate;
   a first gate insulating film provided on the element region;
   a charge accumulation layer provided on the first gate insulating film;
   a second gate insulating film which has a first portion covering an upper surface of the charge accumulation layer and a second portion covering a side surface of the charge accumulation layer when a side of a surface on which the element region of the semiconductor substrate is demarcated is an upper side; and
   a control gate electrode provided above the upper surface and the side surface of the charge accumulation layer via the second gate insulating film, wherein a breakdown voltage of the first portion is higher than a breakdown voltage of the second portion, and
   the first portion is formed of a first material,
   the second portion is formed of a second material, and
   a breakdown voltage per unit film thickness of the first material is higher than a breakdown voltage per unit film thickness of the second material.

2. The semiconductor memory device according to claim 1, wherein
   a width of the charge accumulation layer in a direction along the surface of the semiconductor substrate is smaller than the thickness of the charge accumulation layer in a direction perpendicular to the surface of the semiconductor substrate.

3. The semiconductor memory device according to claim 1, wherein
   the first portion is thicker than the second portion.

4. The semiconductor memory device according to claim 1, wherein
   a film density of the first portion is higher than a film density of the second portion.

5. The semiconductor memory device according to claim 1, wherein
   an oxygen content of the first portion is higher than an oxygen content of the second portion.

6. The semiconductor memory device according to claim 1, wherein a dielectric constant of the first material is higher than a dielectric constant of the second material.

7. The semiconductor memory device according to claim 1, wherein
the upper surface of the charge accumulation layer is curved upward in a convex shape, and
the first portion is curved upward in a convex shape along the upper surface of the charge accumulation layer.

8. The semiconductor memory device according to claim 7, wherein
the upper surface of the charge accumulation layer is curved upward in an arc shape, and
the first portion is curved upward in an arc shape along the upper surface of the charge accumulation layer.

9. The semiconductor memory device according to claim 3, wherein
the upper surface of the charge accumulation layer is curved upward in a convex shape, and
the first portion is curved upward in a convex shape along the upper surface of the charge accumulation layer.

10. The semiconductor memory device according to claim 1, wherein
the second gate insulating film further has a third portion covering a boundary portion between the upper surface and side surface of the charge accumulation layer,
an angle formed between the upper surface and the side surface at the boundary portion is greater than 90°, and
an angle formed between the first portion and the second portion at the third portion is greater than 90°.

11. A semiconductor memory device, comprising:
an element region demarcated by an element isolating portion within a semiconductor substrate;
a first gate insulating film provided on the element region;
a charge accumulation layer provided on the first gate insulating film;
a second gate insulating film which has a first portion covering an upper surface of the charge accumulation layer and a second portion covering a side surface of the charge accumulation layer when a side of a surface on which the element region of the semiconductor substrate is demarcated in an upper side; and
a control gate electrode provided above the upper surface and the side surface of the charge accumulation layer via the second gate insulating film, wherein
a breakdown voltage of the first portion is higher than a breakdown voltage of the second portion,
the second gate insulating film further has a third portion covering a boundary portion between the upper surface and side surface of the charge accumulation layer, and
a breakdown voltage of the third portion is higher than a breakdown voltage of the second portion.

12. The semiconductor memory device according to claim 11, wherein
the third portion is thicker than the second portion.

13. The semiconductor memory device according to claim 11, wherein
the third portion is formed of a first material,
the second portion is formed of a second material, and
a breakdown voltage per unit film thickness of the first material is higher than a breakdown voltage per unit film thickness of the second material.

14. The semiconductor memory device according to claim 13, wherein
a film density of the third portion is higher than a film density of the second portion.

15. The semiconductor memory device according to claim 13, wherein
an oxygen content of the third portion is higher than an oxygen content of the second portion.

16. The semiconductor memory device according to claim 13, wherein
a dielectric constant of the first material is higher than a dielectric constant of the second material.

17. The semiconductor memory device according to claim 12, wherein
the first portion is thicker than the second portion.

18. The semiconductor memory device according to claim 13, wherein
the first portion is formed of the first material.

* * * * *